United States Patent
Inakawa

(10) Patent No.: US 7,859,306 B2
(45) Date of Patent: Dec. 28, 2010

(54) LOAD DRIVING CIRCUIT

(75) Inventor: Yuichi Inakawa, Ota (JP)

(73) Assignees: Sanyo Electric Co., Ltd., Osaka (JP); Sanyo Semiconductor, Co. Ltd., Gunma (JP)

( * ) Notice: Subject to any disclaimer, the term of this patent is extended or adjusted under 35 U.S.C. 154(b) by 0 days.

(21) Appl. No.: 12/505,351

(22) Filed: Jul. 17, 2009

(65) Prior Publication Data

US 2010/0013524 A1 Jan. 21, 2010

(30) Foreign Application Priority Data

Jul. 17, 2008 (JP) .............................. 2008-186439

(51) Int. Cl.
*H03K 19/0175* (2006.01)
(52) U.S. Cl. .......................................... 326/83; 326/86
(58) Field of Classification Search ............. 326/82–83, 326/86–88; 327/108, 109
See application file for complete search history.

(56) References Cited

U.S. PATENT DOCUMENTS 5,283,479 A * 2/1994 Rosseel et al. .............. 326/104
5,914,617 A * 6/1999 Bartlett ......................... 326/81
6,204,654 B1 * 3/2001 Miranda et al. ............. 323/316

FOREIGN PATENT DOCUMENTS

JP 2007-142816 6/2007

* cited by examiner

*Primary Examiner*—James Cho
(74) *Attorney, Agent, or Firm*—SoCal IP Law Group LLP; Steven C. Sereboff; John E. Gunther

(57) ABSTRACT

A load driving circuit comprising: a bias current circuit configured to generate a bias current having a current value corresponding to a level of a control signal; a control circuit configured to control the level of the control signal so that the bias current is increased and thereafter decreased, when an input signal reaches one logic level; and a driving circuit configured to raise an output voltage for driving a load to a higher logic level in a time corresponding to the current value of the bias current, when the input signal reaches the one logic level, and lower the output voltage to a lower logic level, when the input signal reaches the other logic level.

2 Claims, 4 Drawing Sheets

LOAD DRIVING CIRCUIT

CROSS-REFERENCE TO RELATED APPLICATION

This application claims the benefit of priority to Japanese Patent Application No. 2008-186439, filed Jul. 17, 2008, of which full contents are incorporated herein by reference.

BACKGROUND OF THE INVENTION

1. Field of the Invention

The present invention relates to a load driving circuit.

2. Description of the Related Art

In a switching power supply circuit or inverter circuit, input voltage is converted by switching a power MOSFET, in general. In the switching of power MOSFET, a load driving circuit with high current driving capacity is employed in many cases. FIG. 3 is a diagram illustrating a general configuration of a load driving circuit for driving the power MOSFET (Japanese Patent Laid-Open Publication No. 2007-142816, for example). A load driving circuit 100 is a circuit for changing according to an input voltage IN an output voltage OUT of a class AB output circuit 230 with high current driving capacity. The load driving circuit 100 includes an NPN transistor Q100, a PNP transistor Q110, current sources 200 and 210, a switch 220, and the class AB output circuit 230. The class AB output circuit 230 includes NPN transistors Q120 and Q130, PNP transistors Q140 and Q150, and diodes 300 and 310. It is assumed that the load driving circuit 100 is an integrated circuit.

If a high-level (hereinafter referred to as H level) input voltage IN is applied to a base electrode of the NPN transistor Q100, which is an input of the load driving circuit 100, the NPN transistor Q100 and the current source 200 constitute an inverter, so that the NPN transistor Q120 is turned off. Therefore, the PNP transistor Q150 is turned off. Since the switch 220 is turned on in response to the input signal IN at the H level, a current I1 of the current source 210 flows through the PNP transistor Q110. Since the PNP transistor Q110 and the PNP transistor Q140 constitute a current mirror circuit, the PNP transistor Q140 supplies a current corresponding to the current I1 to the NPN transistor Q130. As a result, since the NPN transistor Q130 is turned on, the output voltage OUT becomes the H level. On the other hand, when the input voltage IN becomes a low level (hereinafter referred to as L level), the NPN transistor Q120 is turned on. Since the switch 220 is turned off, the PNP transistor Q110 is turned off, and the PNP transistor Q140 is also turned off. Therefore, the output voltage OUT reaches the L level. The diodes 300 and 310 are elements for lowering the voltage of the base electrode of the NPN transistor Q130 so that the NPN transistor Q130 is turned off earlier if the NPN transistor Q120 is turned on.

As mentioned above, in the load driving circuit 100, it is required that the NPN transistor Q130 be turned on in order that the output voltage OUT shall be at the H level in accordance with the input voltage IN. The NPN transistor Q130 is designed greater in size so as to heighten the current driving capacity of the class AB output circuit 230. As a result, a parasitic capacity of the NPN transistor Q130 is increased. Thus, a time from when the input voltage IN has reached the H level until when the output voltage OUT reaches the H level in a case where the current I1 of the current source 210 is small, is longer than the time in a case where the current I1 is great, as shown in FIG. 4. Therefore, the current I1 of the current source 210 needs to be increased in order to reduce a rise time of the output voltage OUT, and thus, there is a problem that consumption current of the load driving circuit 100 is increased.

SUMMARY OF THE INVENTION

A load driving circuit according to an aspect of the present invention, comprises: a bias current circuit configured to generate a bias current having a current value corresponding to a level of a control signal; a control circuit configured to control the level of the control signal so that the bias current is increased and thereafter decreased, when an input signal reaches one logic level; and a driving circuit configured to raise an output voltage for driving a load to a higher logic level in a time corresponding to the current value of the bias current, when the input signal reaches the one logic level, and lower the output voltage to a lower logic level, when the input signal reaches the other logic level.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
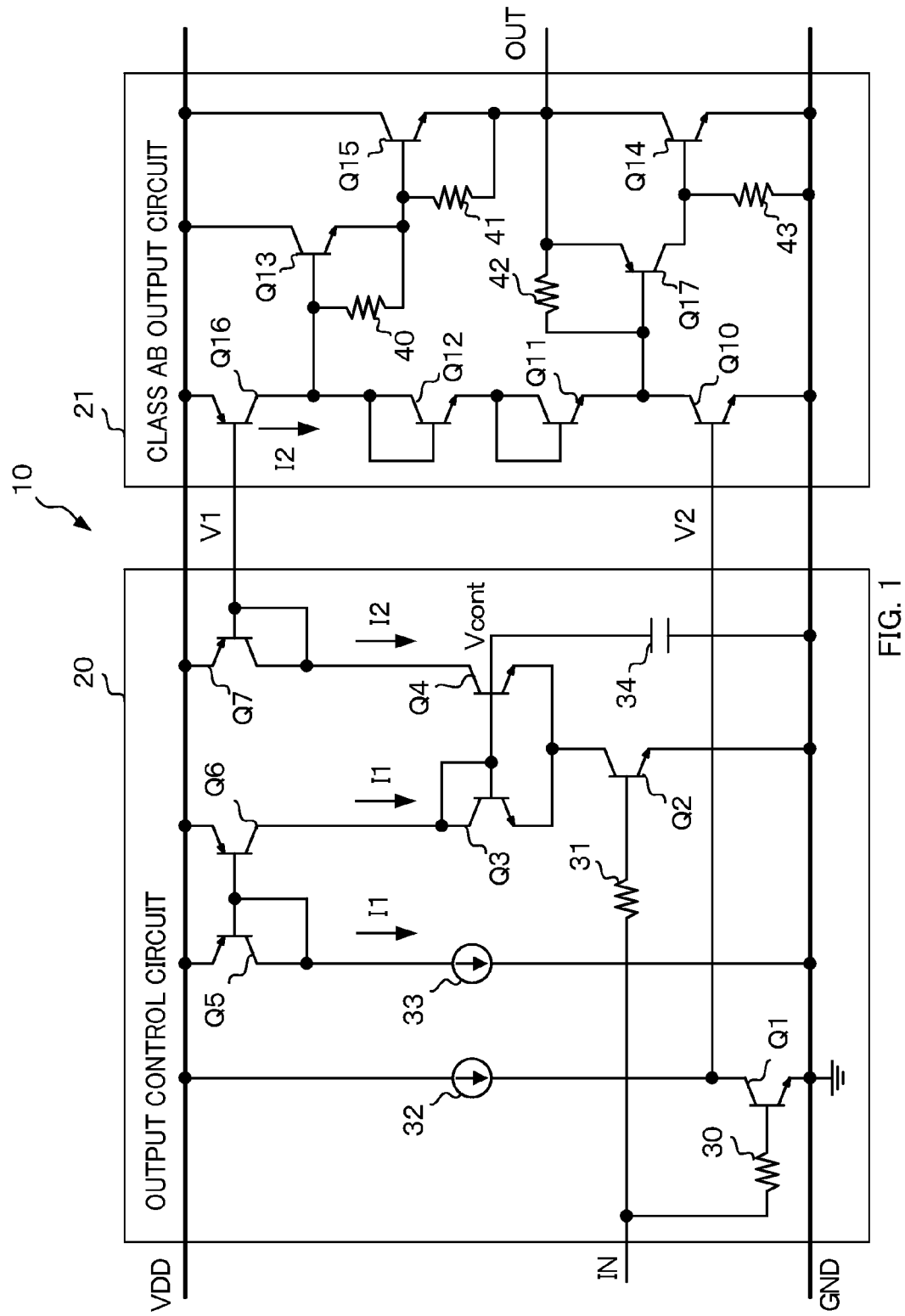
FIG. 1 is a diagram illustrating a configuration of a load driving circuit 10 according to an embodiment of the present invention.

FIG. 1 is a diagram illustrating a configuration of the load driving circuit 10 according to an embodiment of the present invention. The load driving circuit 10 is a circuit for changing an output voltage OUT for driving a load in accordance with an input voltage IN, and includes an output control circuit 20 and a class AB output circuit 21. It is assumed that the output voltage OUT of the load driving circuit 10 according to an embodiment of the present invention is applied to a gate of a power MOSFET (not shown) for controlling an output voltage of a switching power source, for example. It is also assumed that the load driving circuit 10 is an integrated circuit and the input voltage IN to be input to the load driving circuit 10 is a signal indicating a logic level.

The output control circuit 20 outputs a control voltage V1 for controlling a current value of a driving current of the class AB output circuit 21 and a control voltage V2 for changing the output voltage OUT of the class AB output circuit 21 in accordance with a logic level of the input voltage IN. The output control circuit 20 includes resistors 30 and 31, current sources 32 and 33, a capacitor 34, NPN transistors Q1 to Q4, and PNP transistors Q5 to Q7.

Since the current source 32 and the NPN transistor Q1 constitute an inverter, when the input voltage IN applied to one end of the resistor 30 reaches the H level, a voltage of a collector electrode of the NPN transistor Q1 becomes the L level. On the other hand, if the input voltage IN reaches the L level, the voltage of the collector electrode of the NPN transistor Q1 becomes the H level. The voltage of the collector electrode of the NPN transistor Q1 is referred to as a control voltage V2.

The PNP transistors Q5 and Q6 constitute a current mirror circuit. In an embodiment according to the present invention, it is assumed that the PNP transistors Q5 and Q6 are the same in size. Therefore, the PNP transistor Q6 outputs a current having the same current value as that of the current source 33 as a collector current. In an embodiment according to the present invention, since the current of the current source 33 is set at a current I1, the collector current (constant current) of the PNP transistor Q6 also is at the current I1.

The NPN transistors Q3 and Q4 constitute a current mirror circuit. In an embodiment according to the present invention, it is assumed that the NPN transistors Q3, Q4 are the same in size. Each emitter electrode of the NPN transistors Q3 and Q4 is connected to the collector electrode of the NPN transistor Q2, and each base electrode of the NPN transistors Q3 and Q4 is connected to one end of the capacitor 34. Here, an operation of a circuit including the resistor 31, the capacitor 34, and the NPN transistors Q2 to Q4 will be described. First, when the input voltage IN applied to one end of the resistor 31 reaches the L level, the NPN transistor Q2 is turned off. Thus, a current does not flow through the current mirror circuit constituted by the NPN transistors Q3 and Q4, and the current I1 from the PNP transistor Q6 charges the capacitor 34. Therefore, the capacitor 34 rises in charging voltage to a level close to a power supply voltage VDD, or specifically, a level lower than the power supply voltage VDD by a base-emitter voltage of the PNP transistor Q6. Since each base electrode of the NPN transistors Q3 and Q4 is connected to one end of the capacitor 34, the base electrodes of the NPN transistors Q3 and Q4 also rise in voltage to a level close to the power supply voltage VDD. In an embodiment according to the present invention, a voltage of a node at which each base electrode of the NPN transistors Q3 and Q4 and one end of the capacitor 34 are connected, is referred to as a control voltage Vcont (control signal).

Next, when the input voltage IN applied to one end of the resistor 31 reaches the H level, the NPN transistor Q2 is turned on. When the NPN transistor Q2 is turned on, each emitter electrode of the NPN transistors Q3 and Q4 is connected to a ground GND through an ON resistance of the NPN transistor Q2. Therefore, when the input voltage IN reaches the H level, the capacitor 34 starts discharging. When the capacitor 34 starts discharging, the control voltage Vcont drops from the level close to the power supply voltage VDD. And eventually, the control voltage Vcont drops to a voltage determined on the basis of the current I1, that is, a voltage of the base electrode of the NPN transistor Q3 when the current I1 is supplied to the diode-connected NPN transistor Q3. That is, a control signal output circuit (the NPN transistors Q2 and Q3) for controlling the level of the control voltage Vcont controls the level thereof so that the capacitor 34 is charged with the current I1 when the input voltage IN reaches the L level; and controls the level thereof according to the sum of a discharging current from the capacitor 34 and the current I1 so that the collector current of the NPN transistor Q4 is increased and thereafter decreased, when the input signal IN reaches the H level. Therefore, when the NPN transistor Q2 is changed from OFF to ON, the collector current of the NPN transistor Q4 first rises to a current value of a level corresponding to the control voltage Vcont from a state where generation of the collector current is stopped. The collector current of the NPN transistor Q4 is then reduced to become the current I1 in the end. In an embodiment according to the present invention, the collector current (bias current) of the NPN transistor Q4 is set at a current I2. Since the current I2, which is the collector current of the NPN transistor Q4, is a sink current of the diode-connected PNP transistor Q7, the control voltage V1, which is a voltage of the base electrode of the PNP transistor Q7, is changed according to the current I2. The NPN transistors Q2 and Q4 and the PNP transistor Q7 in an embodiment according to the present invention correspond to a bias current circuit, and the NPN transistors Q2 and Q3 and the PNP transistor Q6 correspond to a control circuit. The PNP transistor Q6 corresponds to a constant current circuit, and the NPN transistors Q2 and Q3 correspond to the control signal output circuit.

The class AB output circuit 21 (driving circuit) changes the output voltage OUT to the H level in a rise time corresponding to the level of the control voltage V1, when the control voltage V2 reaches the L level; and the class AB output circuit 21 changes the output voltage OUT to the L level when the control voltage V2 reaches the H level. The class AB output circuit 21 includes resistors 40 to 43, NPN transistors Q10 to Q15, and the PNP transistors Q16 and Q17. In an embodiment according to the present invention, since each of the NPN transistors Q14 and Q15 is a transistor for directly driving a load, it is assumed that the transistors are large in size.

The PNP transistors Q7 and Q16 constitute a current mirror circuit. In an embodiment according to the present invention, since it is assumed that the PNP transistors Q7 and Q16 are the same in size, the collector current of the PNP transistor Q16 is the current I2.

The NPN transistor Q13 is a transistor for driving the NPN transistor Q15 of a large size, in accordance with the current I2 from the PNP transistor Q16. Specifically, when the current I2 is supplied to the base electrode of the NPN transistor Q13, the NPN transistor Q13 amplifies the current I2 to be output to the NPN transistor Q15. Therefore, the NPN transistor Q15 is turned on in a time corresponding to the current value of the current I2.

The NPN transistor Q10 is a transistor for controlling whether or not to supply the current I2 to the NPN transistor Q13 according to the level of the control voltage V2, and for controlling a conduction state of the PNP transistor Q17.

The PNP transistor Q17 is a transistor for driving the NPN transistor Q14 of a large size, according to the conduction state of the NPN transistor Q10. Specifically, when the NPN transistor Q10 is turned on, the PNP transistor Q17 is turned on. The PNP transistor Q17 amplifies the sink current from the load applied with the output voltage OUT to be supplied to the NPN transistor Q14. As a result, the NPN transistor Q14 is turned on in a time corresponding to the sink current from the load. On the other hand, when the NPN transistor Q10 is turned off, the PNP transistor Q17 is turned off, so that the NPN transistor Q14 is also turned off. The resistors 40 and 41 are resistors for preventing voltages of the base electrodes of the NPN transistors Q13 and Q15 from being unstable, respectively, when the load driving circuit 10 is started or stopped, for example. Similarly, the resistors 42 and 43 are resistors for preventing voltages of the base electrodes of the PNP transistor Q17, the NPN transistor Q14 from being unstable, respectively. The diode-connected NPN transistors Q11 and Q12 are elements for turning off the NPN transistor Q13 in a short time when the NPN transistor Q10 is changed from OFF to ON. Specifically, when the NPN transistor Q10 is turned on, the voltage of the base electrode of the NPN transistor Q13 is connected to the ground GND through the ON resistance of the diode-connected NPN transistors Q11 and Q12 and the NPN transistor Q10. Thus, the NPN transistor Q13 can be turned off earlier than in the case where there are no diode-connected NPN transistors Q11 and Q12.

Here, there will be described in an operation of the class AB output circuit 21. When the control voltage V2 is at the L level, the NPN transistor Q10 is turned off, so that the current I2 is supplied to the NPN transistor Q13. Since the NPN transistor Q13 amplifies the current I2 to be supplied to the NPN transistor Q15, the NPN transistor Q15 is turned on in the time corresponding to the current value of the current I2. When the NPN transistor Q10 is turned off, the PNP transistor Q17 and the NPN transistor Q14 are turned off. Therefore, the output voltage OUT reaches the H level in the time corresponding to the current value of the current I2.

On the other hand, when the control voltage V2 is at the H level, the NPN transistor Q10 is turned on, and thus, the current I2 flows to the ground GND through the diode-connected NPN transistors Q11 and Q12. As a result, contrary to the above operation, the NPN transistors Q13 and Q15 are turned off. The PNP transistor Q17 and the NPN transistor Q14 are turned on. Therefore, the output voltage OUT becomes the L level.

Figure 2:
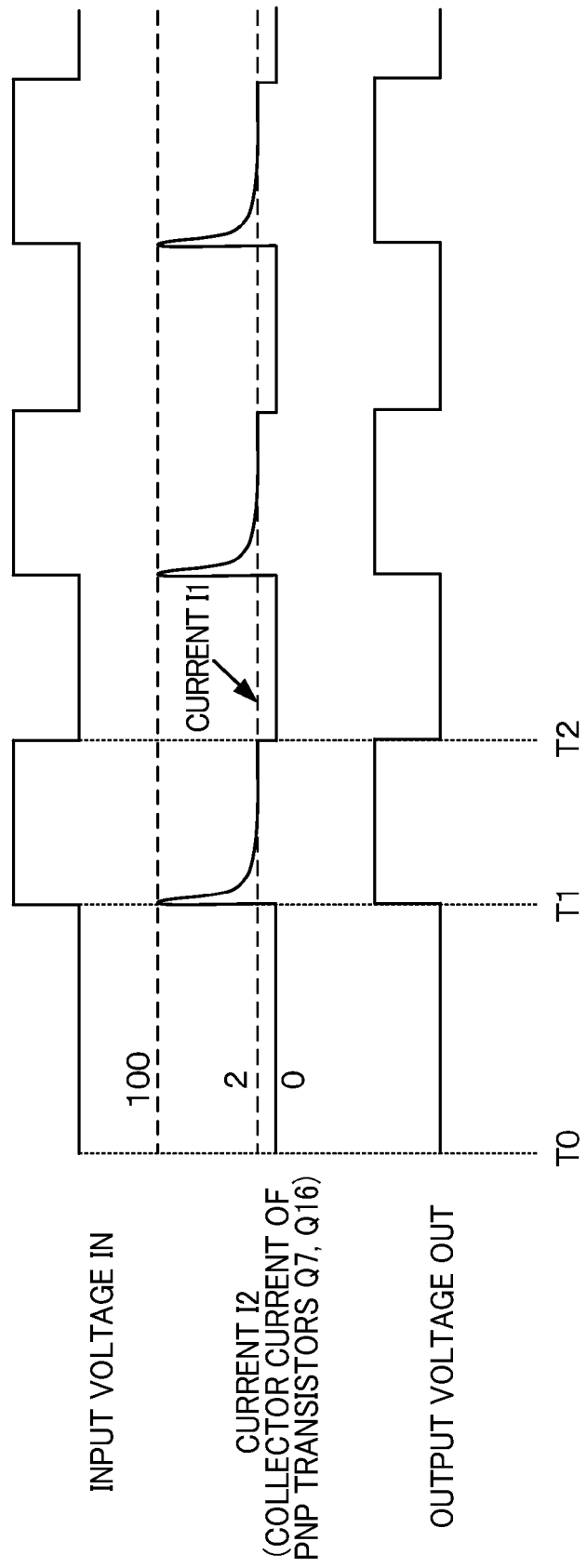
FIG. 2 is a diagram for describing an operation of a load driving circuit 10.
Figure 3:
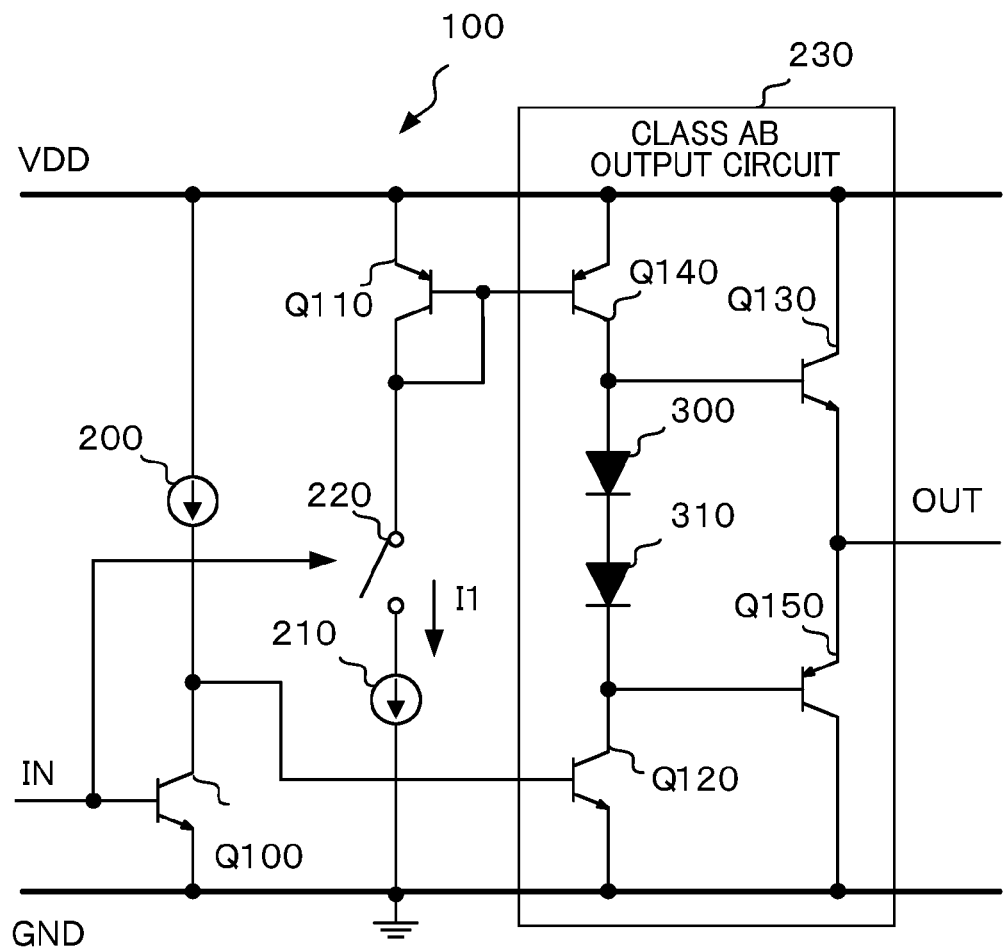
FIG. 3 is a diagram illustrating a configuration of a general load driving circuit 100.
Figure 4:
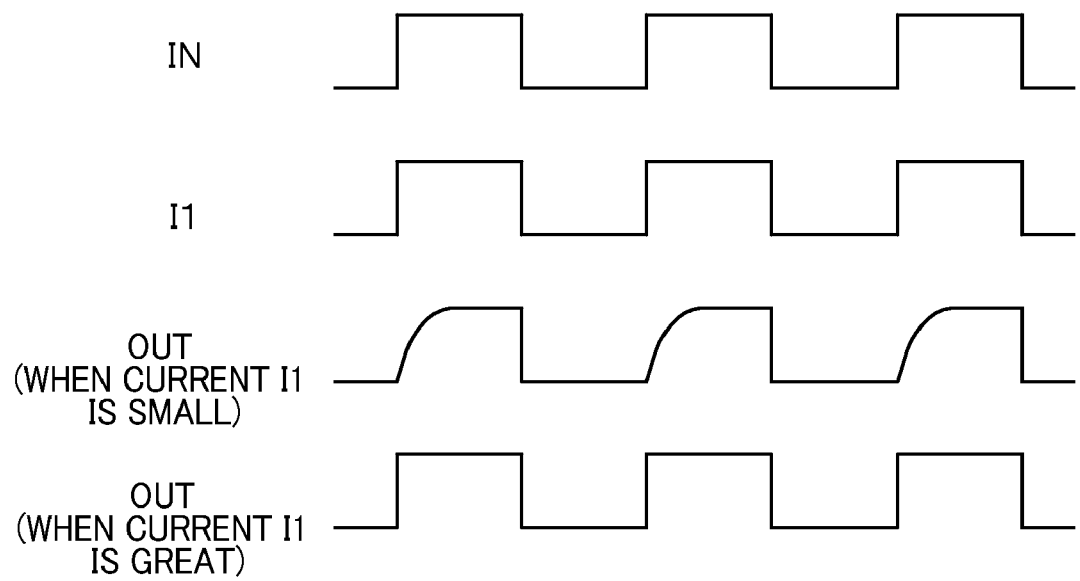
FIG. 4 is a diagram for explaining an operation of a load driving circuit 100.

Here, there will be described an operation of the load driving circuit 10 with reference to FIG. 2. In an embodiment according to the present invention, it is assumed that the load driving circuit 10 is started at time T0, and such an input voltage IN with a square wave as to become the H level at time T1 is input. It is also assumed that the input voltage IN remains at the L level till the time T1, and that the current I1 is set at 2 μA, for example. First, when the load driving circuit 10 is started at the time T0, the current sources 32 and 33 start generating currents. Since the input voltage IN is at the L level, the NPN transistor Q2 is turned off, and the capacitor 34 is charged with the current of 2 μA output from the PNP transistor Q6. The current I2 of the PNP transistor Q7 and the PNP transistor Q16 becomes zero. Moreover, since the control voltage V2 reaches the H level, the output voltage OUT of the class AB output circuit 21 reaches the L level.

Next, at the time T1, since the level of the input voltage IN becomes the H level, the NPN transistor Q2 is turned on, and the capacitor 34 starts discharging. Since the capacitor 34 is charged during time from the time T0 to the time T1, the control voltage Vcont rises to the level close to the power supply voltage VDD. Thus, at the time T1, if the NPN transistor Q2 is turned on, the current I2 corresponding to the control voltage Vcont of a high level flows through the NPN transistor Q4. In an embodiment according to the present invention, it is assumed that the current I2 at the time T1 is set at 100 μA, for example. As mentioned above, since the PNP transistors Q7 and Q16 constitute a current mirror circuit, the collector current I2 of the PNP transistor Q16 is similarly changed. Therefore, when the input voltage IN becomes the H level, the PNP transistor Q16 supplies the current of 100 μA to the NPN transistor Q13, first. Since the NPN transistor Q13 amplifies the current of 100 μA to be output to the NPN transistor Q15, even the NPN transistor Q15 with a great parasitic capacity can be turned on in a short time. As a result, the output voltage OUT can reach the H level in a short time.

As mentioned above, the control voltage Vcont drops in level to a voltage determined by supply of the current I1 of 2 μA to the diode-connected NPN transistor Q3. Since the NPN transistors Q3 and Q4 are operated as a current mirror circuit with a current ratio of 1:1, the current I2 drops to 2 μA as a result. When the input voltage IN reaches the L level at the time T2, the current I2 becomes zero as in the case of the above-mentioned time T0, and thus, the output voltage OUT reaches the L level. At the time T2 and thereafter, the above-mentioned operation is repeated according to the level of the input voltage IN.

In the load driving circuit 10 according to an embodiment of the present invention with the above mentioned configuration, when the input voltage IN reaches the H level, the NPN transistors Q2 and Q3 control the control voltage Vcont so as to increase the current I2, which is a collector current of the NPN transistor Q4, from zero to 100 μA. Since the current I2 flows through the PNP transistor Q16 as well, the current I2 is supplied to the NPN transistor Q15 after having been amplified by the NPN transistor Q13. Therefore, even the NPN transistor Q15 with a great parasitic capacity can be turned on in a short time since the NPN transistor Q15 is driven by a current corresponding to 100 μA when the input voltage IN reaches the H level. As a result, the output voltage OUT of the class AB output circuit 21 can be started up in a short time. In an embodiment according to the present invention, after the current I2, which is a collector current of the NPN transistor Q4, is increased in current value to 100 μA, the current I2 is decreased to 2 μA, which is the current value of the current I1. Therefore, as compared with in the case where the current I2 is maintained at 100 μA all the time while the input voltage IN is at the H level, for example, the output voltage OUT can be changed in the same rise time with less current consumption current.

Moreover, in the load driving circuit 10 according to an embodiment of the present invention, when the input voltage IN is at the L level, the PNP transistor Q17 is turned on with the sink current from the load by turning on the NPN transistor Q10. Therefore, the output control circuit 20 does not have to supply the current I2 to the class AB output circuit 21, so that generation of the current I2 can be stopped, and consequently, current consumption can be reduced.

Furthermore, in an embodiment according to the present invention, while the input voltage IN is at the L level, the control voltage Vcont is brought to the level close to the power supply voltage VDD by charging the capacitor 34 with the current I1. And then, when the input voltage IN reaches the H level, the control voltage Vcont is lowered from the level close to the power supply voltage VDD to the voltage determined on the basis of the current I1. As mentioned above, in an embodiment according to the present invention, by charging/discharging the capacitor 34, the control voltage Vcont is changed, thereby changing the current I2, which is the collector current of the NPN transistor Q4. The control voltage Vcont, which is a voltage of the base electrode of the NPN transistor Q4, can be changed also by switching between two voltages from a voltage generating circuit (not shown) for generating two different voltages using a switch (not shown), to be applied to the base electrode of the NPN transistor Q4, for example. However, in a case of switching the voltage to be directly applied to the base electrode of the NPN transistor Q4, a circuit for generating switching timing or the like needs to be further provided. Therefore, when comparing an embodiment according to the present invention with that in the case of switching the voltage to be directly applied to the base electrode of the NPN transistor Q4, for example, a circuit size can be reduced.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A load driving circuit comprising:
a bias current circuit configured to generate a bias current having a current value corresponding to a level of a control signal;
a control circuit configured to control the level of the control signal so that the bias current is increased and thereafter decreased, when an input signal reaches one logic level; and
a driving circuit configured to
raise an output voltage for driving a load to a higher logic level in a time corresponding to the current value of the bias current, when the input signal reaches the one logic level, and
lower the output voltage to a lower logic level, when the input signal reaches the other logic level,
the control circuit including
a constant current circuit configured to generate a constant current, and
a control signal output circuit configured to
control the level of the control signal so that a capacitor is charged with the constant current when the input signal reaches the other logic level, and
control the level of the control signal according to the sum of a discharging current from the capacitor and the constant current so that the bias current is increased and thereafter decreased, when the input signal reaches the one logic level.

2. The load driving circuit according to claim 1, wherein the bias current circuit generates the bias current of the current value corresponding to the level of the control signal when the input signal reaches the one logic level, and stops generating the bias current when the input signal reaches the other logic level.

* * * * *